United States Patent [19]

Grimes

[11] Patent Number: 5,684,979
[45] Date of Patent: Nov. 4, 1997

[54] METHOD AND MEANS FOR INITIALIZING A PAGE MODE MEMORY IN A COMPUTER

[75] Inventor: Benjamin Russell Grimes, Austin, Tex.

[73] Assignee: International Business Machines Corporation, Armond, N.Y.

[21] Appl. No.: 681,415

[22] Filed: Jul. 23, 1996

Related U.S. Application Data

[63] Continuation of Ser. No. 254,240, Jun. 6, 1994, abandoned.

[51] Int. Cl.$^6$ .................................................... G06F 12/00
[52] U.S. Cl. ............................... 395/497.01; 395/182.05; 395/828
[58] Field of Search ....................... 395/830, 833, 395/835, 800, 282, 284, 405, 442, 484, 497.01, 497.02, 497.03, 287, 293, 299, 728–732, 860, 828, 182.03, 182.05, 183.18, 401, 402; 371/10.1, 11.1, 8.1, 11.3; 340/825.5; 370/85.9, 85.13; 365/230.01, 230.03

[56] References Cited

U.S. PATENT DOCUMENTS

| | | | |
|---|---|---|---|
| 4,303,993 | 12/1981 | Panepinto, Jr. et al. | 365/230 |
| 4,468,729 | 8/1984 | Schwartz | 395/497.03 |
| 4,507,730 | 3/1985 | Johnson et al. | 395/497.01 |
| 4,787,060 | 11/1988 | Boudreau et al. | 364/200 |
| 4,823,324 | 4/1989 | Taylor et al. | 365/230.03 |
| 4,899,275 | 2/1990 | Sachs et al. | 395/403 |
| 4,933,837 | 6/1990 | Freidin | 395/452 |
| 4,965,717 | 10/1990 | Cutts, Jr. et al. | 395/182.1 |
| 4,992,934 | 2/1991 | Portanova et al. | 395/385 |
| 5,006,980 | 4/1991 | Sanders et al. | 395/375 |
| 5,146,589 | 9/1992 | Peet, Jr. et al. | 395/182.01 |
| 5,155,843 | 10/1992 | Stamm et al. | 395/182.03 |
| 5,175,836 | 12/1992 | Morgan | 395/425 |
| 5,193,167 | 3/1993 | Sites et al. | 395/490 |
| 5,218,684 | 6/1993 | Hayes et al. | 395/421.09 |
| 5,253,357 | 10/1993 | Allen et al. | 395/425 |
| 5,305,445 | 4/1994 | Nishikawa | 395/400 |
| 5,327,548 | 7/1994 | Hardell, Jr. et al. | 395/474 |
| 5,357,621 | 10/1994 | Cox | 395/497.03 |
| 5,535,368 | 7/1996 | Ho et al. | 395/497.01 |

FOREIGN PATENT DOCUMENTS

| | | |
|---|---|---|
| 0544127 | 4/1992 | European Pat. Off. . |
| 1539789 | 1/1987 | U.S.S.R. . |

OTHER PUBLICATIONS

IBM TDB (Feb. 1991) Main Memory Failure SIMM Reporting In Fault Tolerant Computer (C. Cheng. B.A. Miller, and P.J. Roy).
IBM TDB (Jun. 1991) Memory Stress Card (B. Carpenter).
IBM TDB (Jan. 1992) Algorithm For Calculating Optimum Receive Buffer Size And Number (P.C. Scherer and R. Stepanian).

*Primary Examiner*—Alpesh M. Shah
*Attorney, Agent, or Firm*—Bernard D. Bogdon

[57] ABSTRACT

A computer system which includes a page mode memory in which a particular piece of data is accessed by first supplying a page or row address, then supplying a column address. These addresses are input to the memory by row address strobe (RAS) signals and column address strobe (CAS) signals. The RAS signals are determined by comparing input CPU addresses with row starting address information stored in registers, each of which corresponds to a memory socket in which a memory module may be installed. An algorithm is described for initializing the memory and its memory controller, including a determination of the starting address information.

2 Claims, 10 Drawing Sheets

FIG. 9B

Presence Register

ID Register

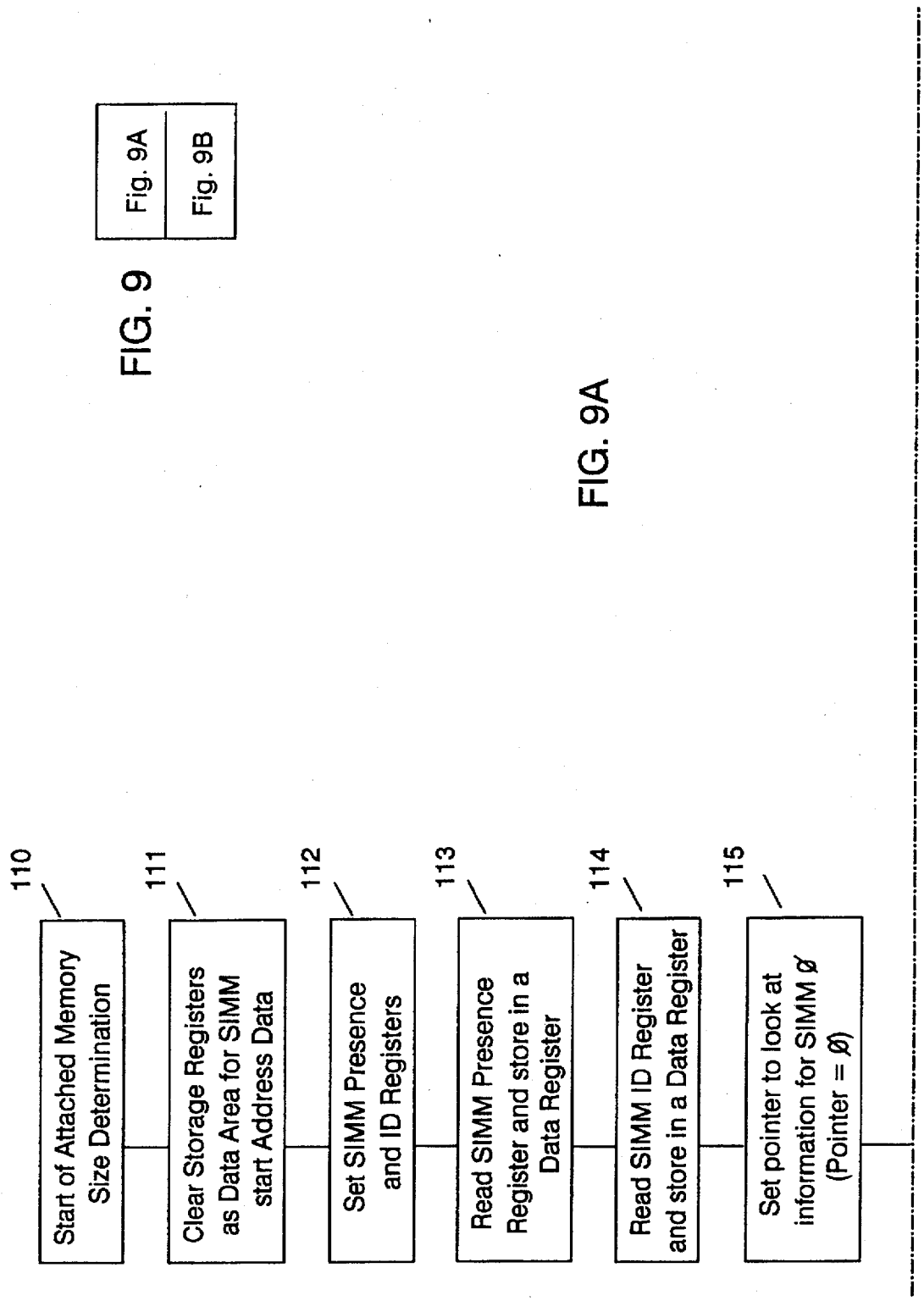

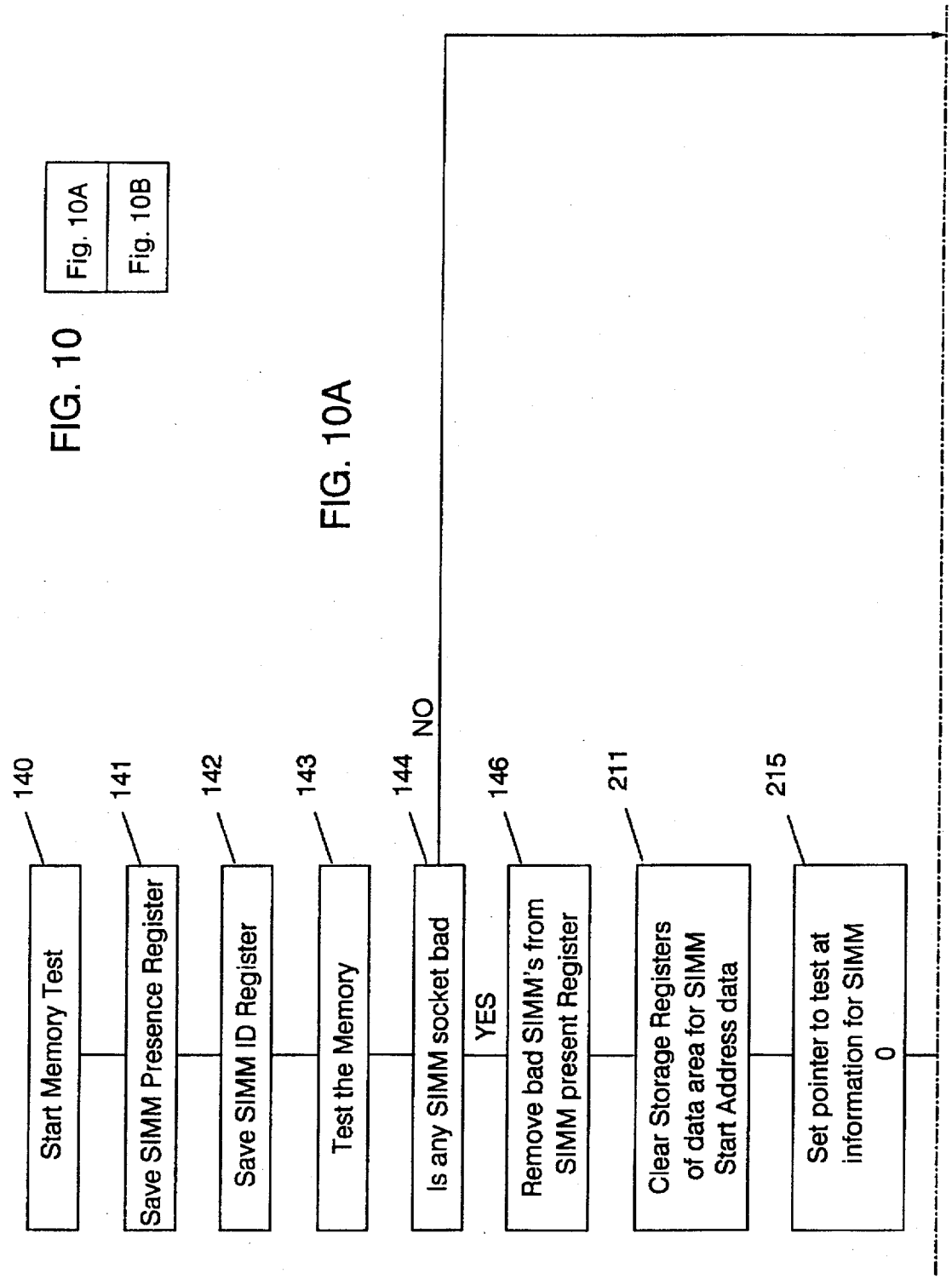

METHOD AND MEANS FOR INITIALIZING A PAGE MODE MEMORY IN A COMPUTER

The application is a continuation of application Ser. No. 08/254,240, filed Jun. 6, 1994, now abandoned.

BACKGROUND OF THE INVENTION

1. Field of the Invention

The present invention relates generally to page mode memories employed in computer systems, and more particularly, to initializing a page mode memory and a memory controller for accessing data from the memory.

2. Description of the Prior Art

Demands on computer systems to achieve greater operating speeds has led to increasing clock frequencies to increase central processing unit (CPU) processing speed and to reduce the access time of main memory.

One approach to decreasing the effective access time required to read data from memory is to use page mode memory. That is, memory is divided into a plurality of pages, each page consisting of a row having a common row address for the entire row. Each row of a page includes a plurality of columns having corresponding column addresses. To access a particular piece of data stored in such a page mode memory, the row address of that data is supplied to the memory to enable selection of the page in memory where the data is located. Then, the column address associated with the data is supplied to the memory to enable selection of the particular piece of data within the addressed row or page. Typically, the addressed data is then read out to the data bus.

One example of a page mode memory is described in detail in U.S. Pat. No. 5,034,917. However, that page mode memory does not permit the use of memory modules of differing sizes and all module sockets must be filled in address order. That is, it is not permitted to leave a first socket empty and fill succeeding sockets with memory modules. In addition, it does not permit defective memory modules in sockets followed by good memory modules.

A simplified block diagram representative of this prior art page mode memory is shown in FIG. 1. A computer system 10 includes a microprocessor 11, a memory controller 12, and a main memory 13 comprised of a plurality of dynamic random access memory (DRAM) single in-line modules 14–17, each installed in a respective socket. The processor 11 has a bus 20 coupled to the memory controller 12. The memory controller includes a row address select and column address select (RAS/CAS) decoder 21, an address decoder/multiplexor 22 and a data buffer 23. The bus 25 includes 8 row address strobe (RAS) lines to select one of eight pages of memory in the DRAMs 14–17, 4 column address strobe (CAS) lines to select one or more bytes of a four byte word and a write enable line which causes either a read or a write cycle. A data bus 26 transfers data between the buffer 23 and DRAMs 14–17.

The address multiplexor 22 derives a page (row) address and word (column) address from the 36 bit address information (A0–A31, BE0–BE3) on bus 20 and provides the page address, then the word address to memory via the multiplexed address bus 27. The byte enable bits BE0–BE3 control the 4 CAS lines to select which bytes of a four byte word are to be retrieved. Bits A11–A19 from processor 11 correspond to the page (row) address and bits A2–A11 correspond to the word (column) address. The RAS and CAS lines of bus 25 are timed to be energized when the page and word addresses are sequentially applied to the multiplexed address bus 27.

SUMMARY OF THE INVENTION

An improved page mode memory is described herein which permits the use alternatively of eight megabyte (8 MB) or 32 MB memory modules in any one socket, and the filled or empty sockets may occur in any sequence. A programmable start address register is provided for each socket.

The invention herein is directed to an improved method and means for initializing the memory controller of an improved page mode memory in a computer system and for re-initializing the memory controller in the event that a defective memory module is subsequently encountered in one of the sockets.

The improvement is characterized by a presence register storing information corresponding to the presence or absence of a memory module in each socket, an ID register storing information corresponding to the amount of memory (size) in each memory module installed in a socket, using the presence and size information to calculate the start address for each socket whether it has an installed memory module or not, storing the start addresses in respective programmed memory start address registers, each corresponding to one of the sockets, testing the memory for faulty memory modules, changing the presence register value for each module found to be faulty to correspond to an empty socket value, recalculating the start address values for the sockets, and storing the new values into the start address registers.

In accordance with these and other objects which will become apparent hereinafter, the instant invention will now be described with particular reference to the accompanying drawings.

DESCRIPTION OF THE PREFERRED EMBODIMENTS

Figure 1:
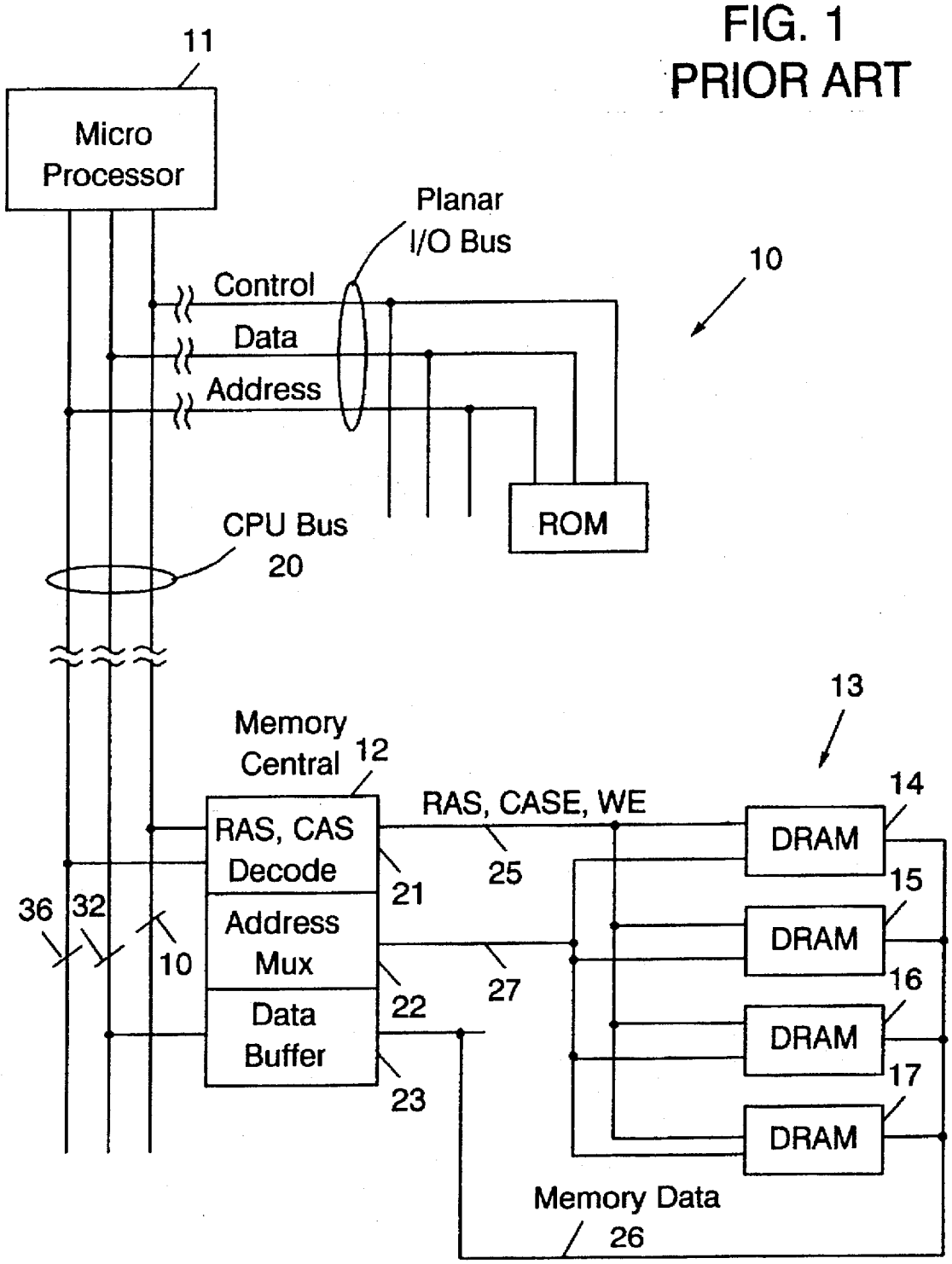
FIG. 1 is a simplified block diagram of a prior art computer system with a page mode memory.
Figure 2:
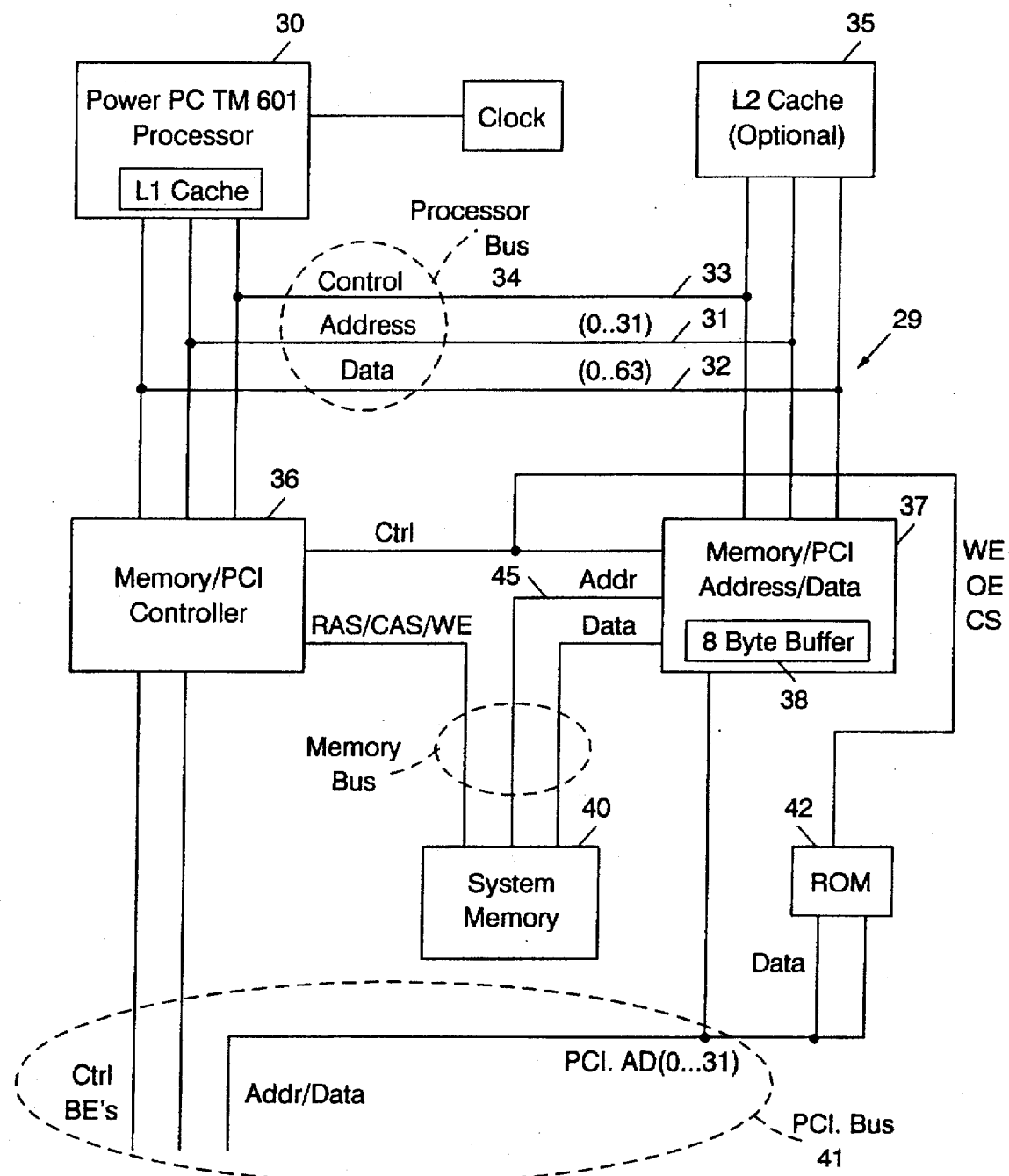
FIG. 2 is a simplified block diagram of a preferred computer system within which the present invention is preferably used.

FIG. 2 is a simplified block diagram of a preferred system 29 within which the present invention is preferably used. A Power PC 601 (trademark of IBM Corporation) processor (CPU) 30, commercially available from IBM Corporation, uses a 32 bit address bus 31, a 64 bit data bus 32, and a control bus 33 which form the processor bus 34. Peripheral component interconnect (PCI) bus 41 couples the memory controller module 36 to read only memory 42 and other peripheral devices (not shown). The module 36 performs functions similar to the RAS/CAS decoder 21 of FIG. 1 and module 37 and its data buffer 38 performs functions similar to the address decoder 22 and buffer 23 of FIG. 1 insofar as accessing the system memory 40, which is a page mode memory. However, as will be seen below, the memory/PCI control module 36 uses a plurality of programmable start address registers, one for each socket in memory 40, which is adapted to receive either an eight megabyte (8MB) or, alternatively, a 32 MB memory module. This feature (programmable address registers) permits the use of different size memory modules and also permits the use of empty sockets followed by sockets with installed memory modules in any order.

The invention of the present application is the method and means for initializing the memory 40 and its controller 36, 37, particularly the programmable start address registers; however, a brief description of the page mode memory (40, 36, 37) will be made to provide a background for the description of the invention.

It will be assumed that the system 29 of FIG. 2 uses the 32 bit address A0–A31 for an address space of four gigabytes (4 GB), of which only a maximum of 25 MG (8 modules×32 MB) is available for the main memory 40. Since this is a page mode memory, the controller 37 decodes the nine most significant address bits A0–A8 and the 19th MSB (A18) of the CPU address to restrict memory address space decode to a resolution of 8 MB, the size of the smallest memory module.

The 8 MB memory modules are 1 MB×72 bits (8 bytes), and 10 bits (A9–A18) and 10 bits (A19–A28) are used by controller 37 to select row and column addresses, providing one thousand pages, each with one thousand double words (8 bytes). The 32 MB memory modules are 4 MB×72 bits and 12 bits (A7–A18) and 10 bits (A19–A28) are used to select one of four thousand pages, and one of the one thousand double words in the selected page. These address bits are applied to the memory 40 via the multiplexed address bus 45 in a manner similar to that described with respect to multiplexed address bus 27 of FIG. 1.

The memory modules 51-0 to 51-7 (FIG. 3) of the preferred embodiment are single in-line memory modules (SIMM), which are installed in sockets 61-0 to 61-7 of memory 40. Controller 36 includes a presence register 70 for storing information corresponding to the presence or absence of a SIMM in each respective socket. An ID register 71 stores information corresponding to the presence of an 8 MB or 32 MB SIMM in each respective socket. Memory Address Programming Registers PR1–PR7 store start addresses for each of the SIMMs installed in sockets 61-1 to 61-7. Register RR0 stores the top of memory address.

The CPU 30 (FIG. 3) uses a plurality of its general purpose registers R0–R9, its adder circuit 72, and an adder register 73, together with the presence register 70, the ID register 71, and the memory address programming registers PR0–PR7 to initialize the memory 40 and memory controller 36 in a manner described in detail below.

Figure 4:
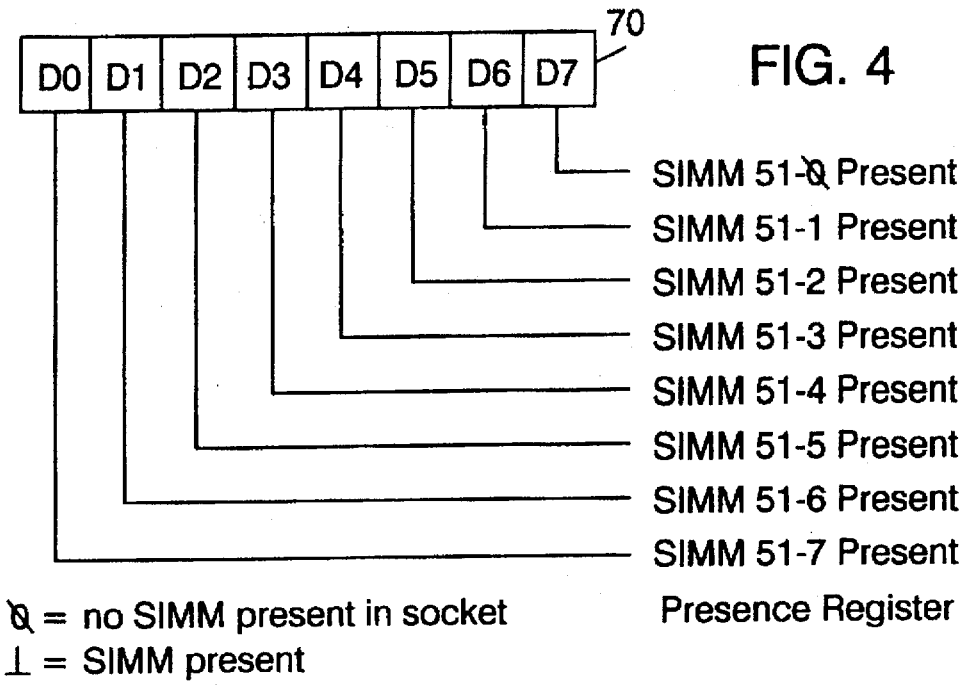
FIGS. 4–6 illustrate information stored in various registers of the system of FIG. 2
Figure 5:
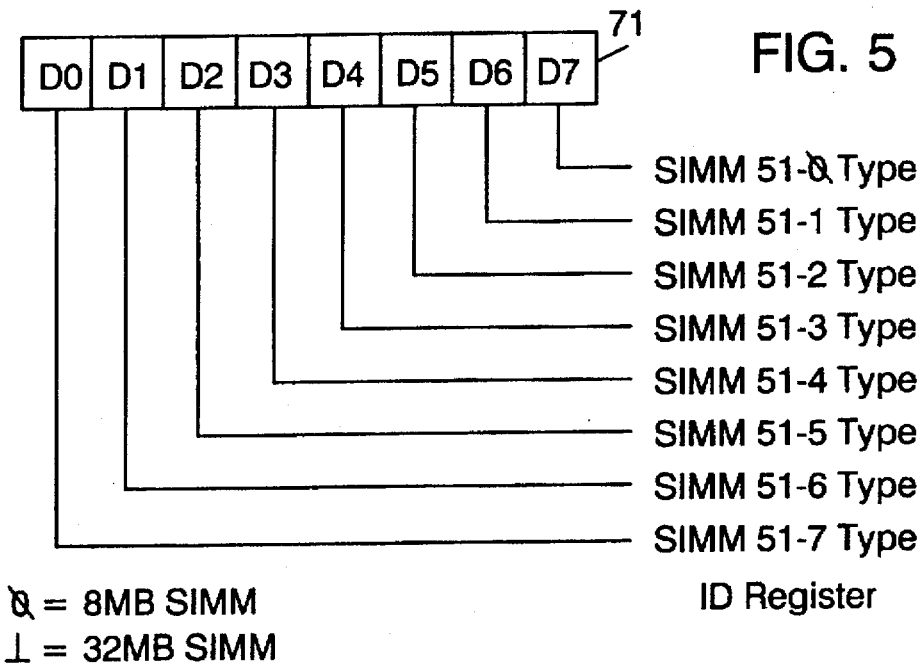
Figure 6:
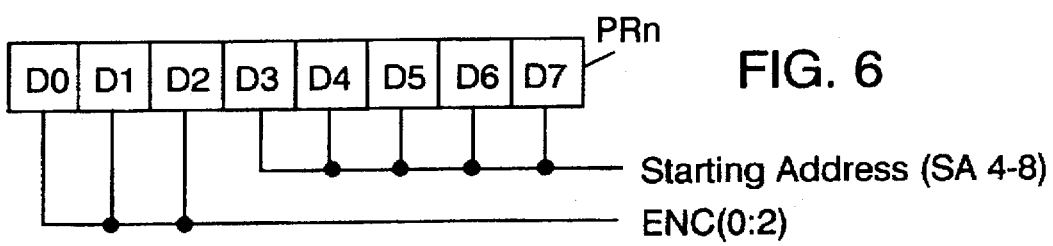

FIGS. 4, 5, and 6, respectively, show the details of information stored in the presence register 70, the ID register 71, and one of the memory address programming registers PRn. The bit positions D0–D7, inclusive of register 70, store a 0 (no SIMM present) or a 1 (SIMM present) for the SIMMs in sockets 61-0 to 61-7, respectively. The bit positions D0–D7 of ID register 71 store a 0 or 1, respectively, for 8 MB or 32 MB SIMMs installed in each of the sockets 61-0 to 61-7, respectively. Each programming register, such as PRn, stores a 5 bit start address SA4–8 for a SIMM in a socket corresponding to the register and a 3 bit value ENC(0-2) corresponding to the socket number.

The starting address bits SA4–8 of each programming (or start address) register PR1–PR7 define the starting address of the SIMM 51-1 to 51-7 which is pointed to by the ENC (0:2) bits of the register. The starting address of the lowest address socket 61-0 is assumed to be 00000; and therefore, PR0 is used to hold the top of valid physical memory which is installed. Each of the start address register PR1–PR7 is programmed as follows: 00000=start address 0, 00001=start address 8 MB, 00010=start address 16 MB, 11110=start address 240 MB, 11111=start address 248 MB.

The start address registers must be programmed in ascending order from PR1 for socket 61-1 (because socket 61-0 is assumed to be address 00000) to PR7 for socket 61-7, the PR0 for the top of memory as will be seen below. If a SIMM is defective or not installed in a socket, it is mapped out by programming the start address as follows: if SIMM X start address=SIMM X+1 start address, SIMM is mapped out.

The following Chart 1 illustrates by way of example one mapping of the start address registers PR0–PR7 identified by ENC bits 0–2 and wherein sockets 61-0, 61-3 to 61-6 are mapped out:

| ENC | | | Starting Address | | | | | |
|---|---|---|---|---|---|---|---|---|
| 2 | 1 | 0 | 4 | 3 | 2 | 1 | 0 | |
| — | — | — | — | — | — | — | — | socket 61-0 start address implied=0 |
| 0 | 0 | 1 | 0 | 0 | 0 | 0 | 0 | socket 61-1 starts at 0MB (0–8MB) |
| 0 | 1 | 0 | 0 | 0 | 0 | 0 | 1 | socket 61-2 starts at 8MB (8–40MB) |
| 0 | 1 | 1 | 0 | 0 | 1 | 0 | 1 | socket 61-3 starts at 40MB (empty) |
| 1 | 0 | 0 | 0 | 0 | 1 | 0 | 1 | socket 61-4 starts at 40MB (empty) |
| 1 | 0 | 1 | 0 | 0 | 1 | 0 | 1 | socket 61-5 starts at 40MB (empty) |
| 1 | 1 | 0 | 0 | 0 | 1 | 0 | 1 | socket 61-6 starts at 40MB (empty) |
| 1 | 1 | 1 | 0 | 0 | 1 | 0 | 1 | socket 61-7 starts at 40MB (40–48MB) |
| 0 | 0 | 0 | 0 | 0 | 1 | 1 | 0 | top of memory at 48BM |

Figure 7:
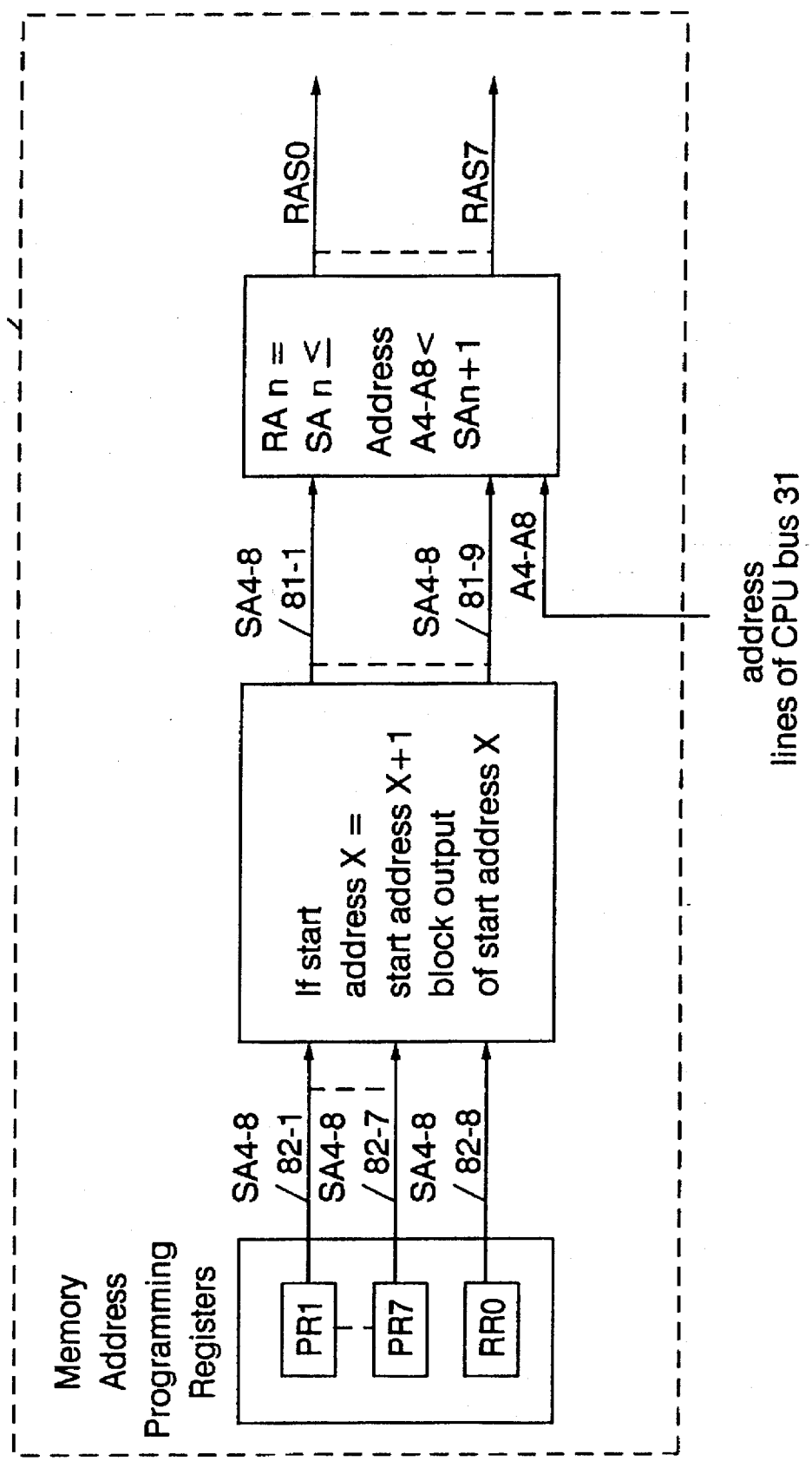
FIG. 7 illustrates diagrammatically components of the system of FIG. 2 used during accessing of main memory by a CPU.

FIG. 7 illustrates the circuits for selecting one of the row address strobe lines RAS0–RAS7 during the accessing of memory 40 by the CPU 30. This differs from the simple decode circuits 21 of FIG. 1 to permit differing size SIMMs 51-0 to 51-7 and empty/filled sockets 61-0 to 61-7 in any order.

The example of Chart 1 will be used to describe the operation of FIG. 7. The starting address bits SA4–8 of each of the programming registers PR0–PR7 inclusive is applied to a logic circuit 80 via buses 82-1 to 82-8, and a fixed value SA00000 is also applied for socket 61-0 via bus 83. Note that PR0 contains the top of memory value. Each address value is compared with the address value of the next succeeding socket in the address ascending order of sockets 61-0 to 61-7. For example, in Chart 1 above, the starting address bits 00000 of socket 61-0 are compared with starting address bits 00000 of socket 61-1 (ENC 001); and, because they are equal, no address signals SA4–8 will appear on bus 81-1. Bus 81-1 corresponds to socket 61-0, which is either empty or has a faulty SIMM, which is considered to be an empty socket.

Similarly, the starting address bits 00000 of socket 61-1 (Chart 1) are compared with starting address bits 00001 of socket 61-2. Since they are not equal, the address bits 00000 of socket 61-1 are applied to bus 81-2 which corresponds to the filled socket 61-1 and its SIMM 51-1.

Similar comparisons are made for each of the remaining starting address values (Chart 1) in the logic circuit 80 as a result of which starting address values of 00001 and 00101 are applied to buses 81-3 (corresponding to socket 61-2 and its installed SIMM 51-2) and 81-8 (corresponding to socket 61-7 and its installed SIMM 51-7). Thus, starting addresses bits SA00000 (corresponding to physical address 0), SA00001 (corresponding to physical address 8 MB), and SA00101 (corresponding to physical address 40 MB) are applied to buses 81-2, 81-3, and 81-8, the buses being coupled to logic circuit 84. The top of memory bits SA00110 are applied to logic 84 via bus 81-9. In addition, address lines A4–A8 of the CPU bus 31 are coupled to the circuit 84. The row address strobe lines RAS0–RAS7 are outputs of the logic circuit 84.

Each SIMM socket has a corresponding RAS line. The formula for activating SIMMn RASn is $$RAS_n = SA_n \leq \text{Address} \leq SA_{n+1}$$

where $RAS_n$ is the RAS signal for the nth SIMM slot.

$SA_n$ is the Starting Address for the nth SIMM slot.

$SA_{n+1}$ is the Starting Address for the (n+1)th SIMM slot.

Address is the input address of memory to be accessed, bits A4–A8

Assuming by way of example that the CPU 30 is in the process of accessing a double word at memory address 4 MB, then address bits A4–A8 of bus 31 are 00000 which is equal to the starting address of SIMM 51-1 in socket 61-1 and is less than the starting address of SIMM 51-2 in socket 61-2. Consequently, logic circuit 84 places a strobe signal on RAS1 which is applied to SIMM 51-1. Assuming by way of example that the CPU 30 is in the process of accessing a double word at memory address 41 MB, then address bits A4–A8 of bus 31 are 00101, which are equal to the SA bits 00101 of socket 61-7, SIMM 51-7 and lower than the SA bits 00110 of the top of memory register PR0. This causes a strobe signal on the output line RAS7. In the event that bits A4–A8 are greater than the top of memory bits, or if the address on the CPU bus bits A0–A8 are greater than the top of physical memory during a CPU memory cycle, conventional means (not shown) cause an exception to be taken to prevent completion of the memory access.

The present invention, which is directed to the method and means for initializing memory 40 and its controller 36, will now be described. The flow chart of FIG. 8 broadly described the initialization process which is performed by the CPU 30 in accordance with memory initialization firmware stored in the ROM 42 and transferred to the L1 cache in CPU 30 for execution.

Figure 8:
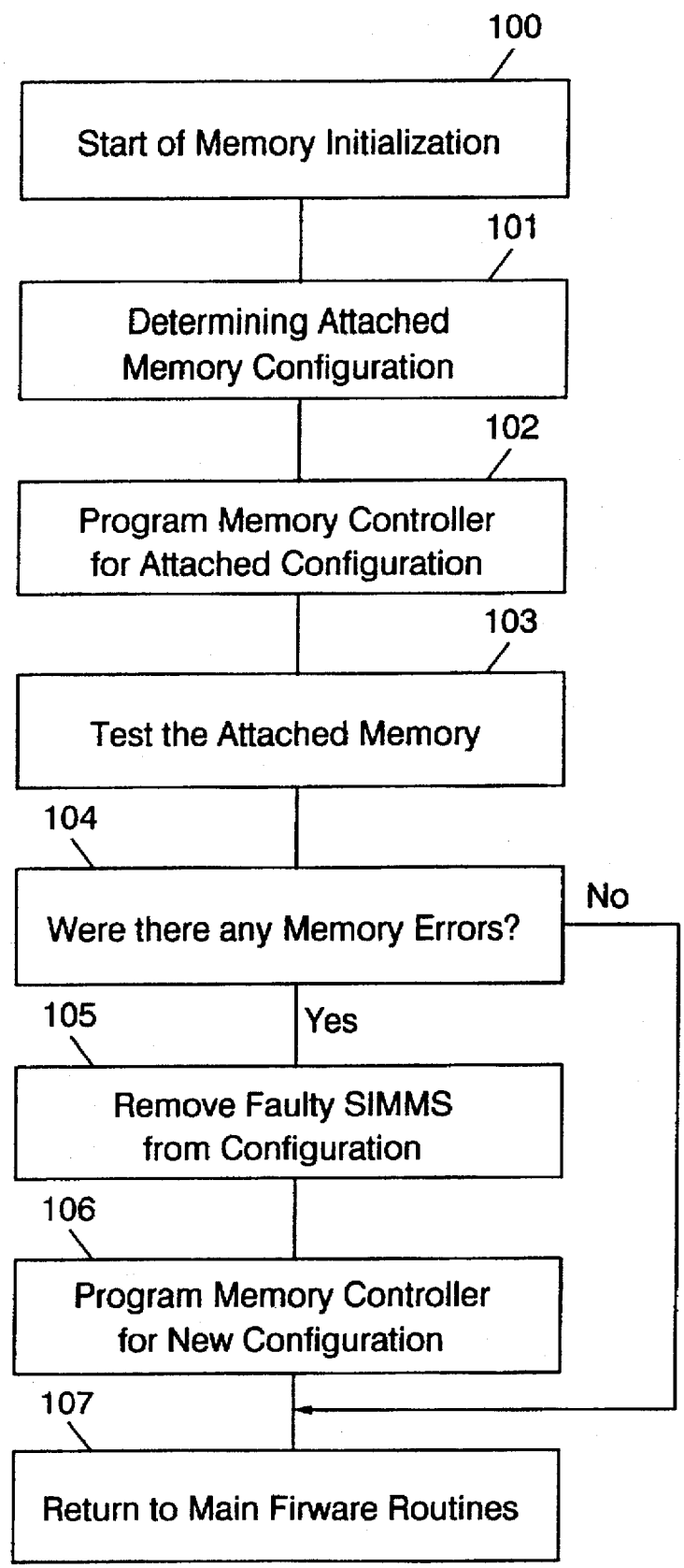
FIGS. 8–10 are flow charts showing the preferred method steps for initializing the main memory and its memory controller in accordance with teachings of the present invention.

In FIG. 8, the memory initialization is started (step 100) by determining the configuration of the memory 40 (step 101). The memory controller 36 is programmed for the attached configuration (step 102). Memory is tested in step 103 and if one or more errors were detected (step 104), the faulty SIMMs are logically removed from the configuration (step 105) and the Memory Controller 36 is reprogrammed (step 106) for the new configuration. After reprogramming in step 106, or in the event that no error was detected in step 104, the program returns to the main firmware routines, step 107.

Figure 9B:
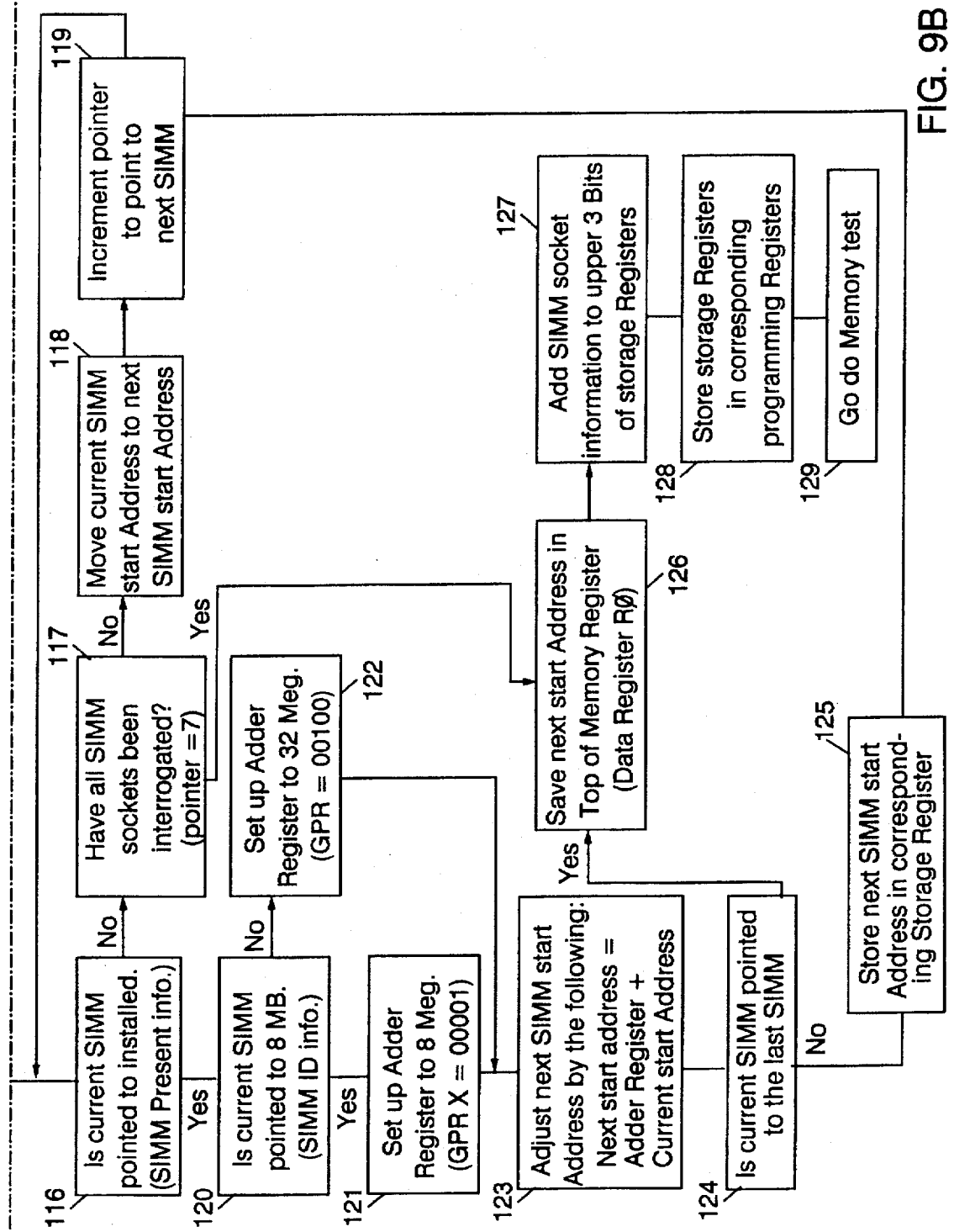

FIG. 9 shows in more detail the determination of the memory configuration (step 101 of FIG. 7) and the programming of the memory controller (step 102 of FIG. 7). Particular reference to FIG. 3 will be made while describing the flow chart of FIG. 9.

Memory size determination is started (step 110) with the CPU 30 clearing (step 111) general purpose storage registers R0 to R7 (set to zero) which will be filled with start addresses for programming registers PR1 to PR7 corresponding to sockets 61-1 to 61-7 and the top of memory address of register PR0. General purpose registers R8, R9 are cleared for subsequently receiving SIMM presence values and ID (size) values.

In step 112, the CPU 30 addresses the presence register 70 and sets it in accordance with the presence values on lines 52-0 to 52-7 which connect a predetermined pin (not shown) in each socket 61-0 to 61-7 to a corresponding bit position of the register 70. If no SIMM is present in a socket 61-0 to 61-7, the corresponding register bit position (FIG. 4) is set to 0 and if a SIMM is present, the bit position is set to 1.

Similarly, the CPU 30 addresses the ID register 71 and sets it in accordance with ID values (8 MB OR 32 MB) on lines 53-0 to 53-7 which connect a different predetermined pin (not shown) in each socket 61-0 to 61-7 to a corresponding bit position of the register 71. The bit positions are set to 0 or 1, respectively, for 8 MB and 32 MB SIMMs.

In step 113, the CPU 30 reads the data in the presence register 70 and stores it into the general purpose register R8.

In step 114, the CPU 30 reads the data in the ID register 71 and stores it into the general purpose register R9.

In step 114, the CPU 30 reads the data in the ID register 71 and stores it into the general purpose register R9.

In step 115, a pointer 90 (FIG. 3) is set to zero examine the information corresponding to SIMM 0.

In step 116, the CPU 30 reads general purpose register R8; and, using the pointer, examines the bit in R8 corresponding to bit D7 of register 7 (FIG. 4) to determine whether or not a SIMM 51-0 is installed in socket 61-0. If no SIMM is installed in socket 61-0, the CPU determines in step 117 whether all sockets have been examined (i.e. pointer=7); and, if not, in step 118 the CPU reads the current start address value (which is 00000 in general purpose register R0) and stores it into the next SIMM address register R1. Both R0 and R1 would then have starting address values of 00000. In step 119, the pointer value is incremented to 1 to point to the next SIMM/socket information and step 116 is repeated.

However, if in step 116 above, the CPU 30 read register R8 and the bit position examined indicated that a SIMM was installed in socket 61-0, the CPU 30 reads general purpose register R9 to examine the bit in R9 corresponding to bit D7 of register 71 (FIG. 5) to determine the type of SIMM (8 MB or 32 MB) which is installed in socket 61-0 (step 120). If the SIMM has 8 MB of memory, the adder register 73 (FIG. 3) is set to a value of 00001 by the CPU 30 in step 121. If the SIMM has 32 MB of memory, the CPU sets a value of 00100 in adder register 73 in step 122.

In step 123, the CPU 30 reads out the current start address for SIMM 51-0 from the general purpose register R0, address 00000, and adds it to the value in the adder register 73 to produce the next SIMM start address, either 00001 or 00100.

In step 124, the CPU determines if the current SIMM pointed to (SIMM 51-0) is in the last socket 61-7 by examining the pointer value for 7. Since the pointer value is still 0, the CPU in step 125 stores the next SIMM start address (calculated in step 123) into the appropriate (next) general purpose register R1. The pointer is then incremented to 1 in step 119 to point to the next SIMM/socket information stored in registers R1, R8, R9. A return to step 116 is made.

This loop is repeated for each of the sockets 61-1 to 61-7. The start address values for each of the sockets (and for the corresponding SIMM 51-1 to 51-7 if installed) are stored in the general purpose registers R2–R7 alternatively in step 118 (current SIMM not installed) or step 125 (current SIMM installed).

When the current SIMM or socket pointed to in step 116 is SIMM 51-7, socket 61-7, the top of memory value must be stored in general purpose register R0. If the CPU 30 in step 116 examines R8 to determine that no SIMM is installed in socket 61-7, the CPU in step 117 determines that all SIMM sockets have been interrogated (i.e. pointer=7). A branch to step 126 is made and the CPU reads the "next start address" (which in the previous loop was stored in general purpose register R7) from register R7 and stores it in register R0, i.e. the top of memory register.

If, in step 116, the CPU 30 determined that a SIMM was installed in socket 61-7, the CPU examines R9 in step 120 to determine the SIMM type (8 MB or 32 MB) and in step 121 or 122 adds the appropriate value to the current start address in register R7 to obtain the next start address. In step 124, the CPU 30 determines that the last SIMM socket is pointed to (pointer=7) and a branch to step 126 is made.

In step 126, the new formed next start address is stored into the top of memory general purpose register R0.

After the top of memory value is stored in R0 (step 126), the CPU in step 127 stores the SIMM socket values into the upper three bits of the storage registers R0 to R7 in sequence.

In step 128, the values in the general purpose storage registers R0 and R7 are read in sequence by the CPU 30 and stored in corresponding programming start address registers PR1–PR7 and top of memory register PR0.

In step 129, the program branches to the memory test routine.

Using Chart 1 above, a brief example of the actions taken in the steps of the flow chart of FIG. 9 will be described.

The information in Chart 1 requires a presence register 70 value of 10000110 for sockets 61-7 to 61-0, respectively. The ID register 71 values are 0XXXX10X for SIMMs 51-7 to 51-0, respectively. These values are stored in registers R8, R9 in steps 113, 114 of FIG. 9.

When sockets 61-0, 61-3, 61-4, 61-5, 61-6 are pointed to in step 116 of each loop, each current start address in registers R0, R3, R4, R8, R6 will be stored respectively in the next succeeding register R1, R4, R5, R6, R7.

When socket 61-1 is pointed to in step 116, it is determined from register R8 that a SIMM is installed and from register R9 it is determined that an 8 MB SIMM is installed (step 120). In step 123, the value 00001 is added to the current start address 00000 in register R1 to calculate a next start address 00001. In step 125, this next start address is stored in register R2 and the loop is repeated starting at step 116. During this next loop, it is determined from registers R8 (step 116) and R9 (step 120) that a 32 MB SIMM is installed in socket 61-2. The value 00100 is added (step 123) to the current start address 00001 in register R2 to calculate the next start address 00101 in the next general purpose register R3 in step 125.

As described above, this next start address 00101 is stored during the execution of four loops into register R4, R5, R6, and R7.

During the execution of the next loop, the pointer=7 and the information corresponding to socket 61-7 is examined. In steps 116, 120, it is determined that an 8 MB SIMM is installed in socket 61-7. In step 123, the value 00001 is added to the current start address 00101 in register R7 and the next address 00110 is stored in register R0 (step 126) because the current socket 61-7 pointed to is the last socket (pointer=7).

Figure 3:
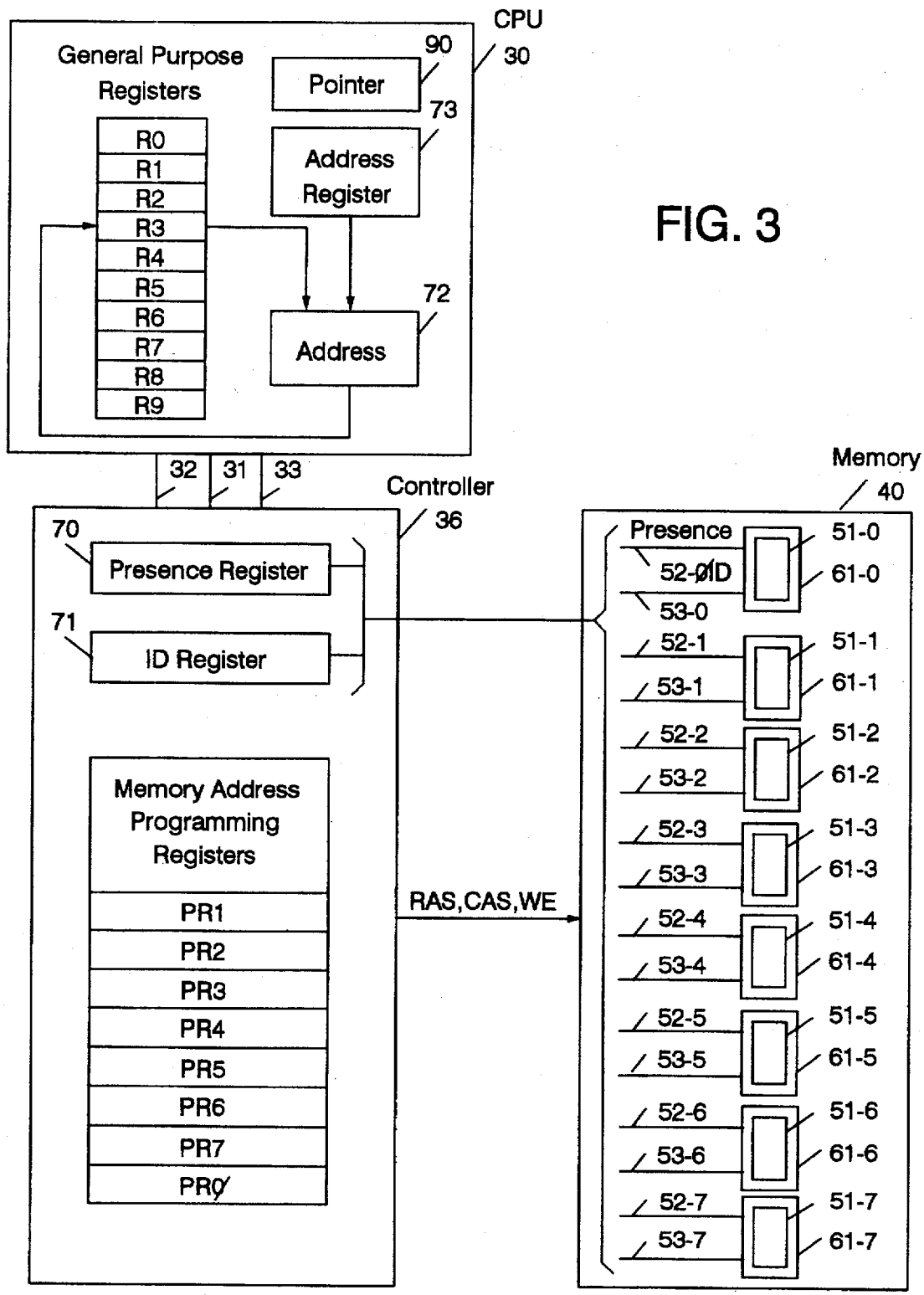
FIG. 3 illustrates diagrammatically certain components of the system of FIG. 2 which are used to implement the present invention.

The socket information is added to registers R0–R7 (step 127) and the information in registers R0–R7 is transferred in step 128 to the programming registers PR0 to PR7 (FIG. 3). This is the start address information shown in Chart 1.

Figure 10B:
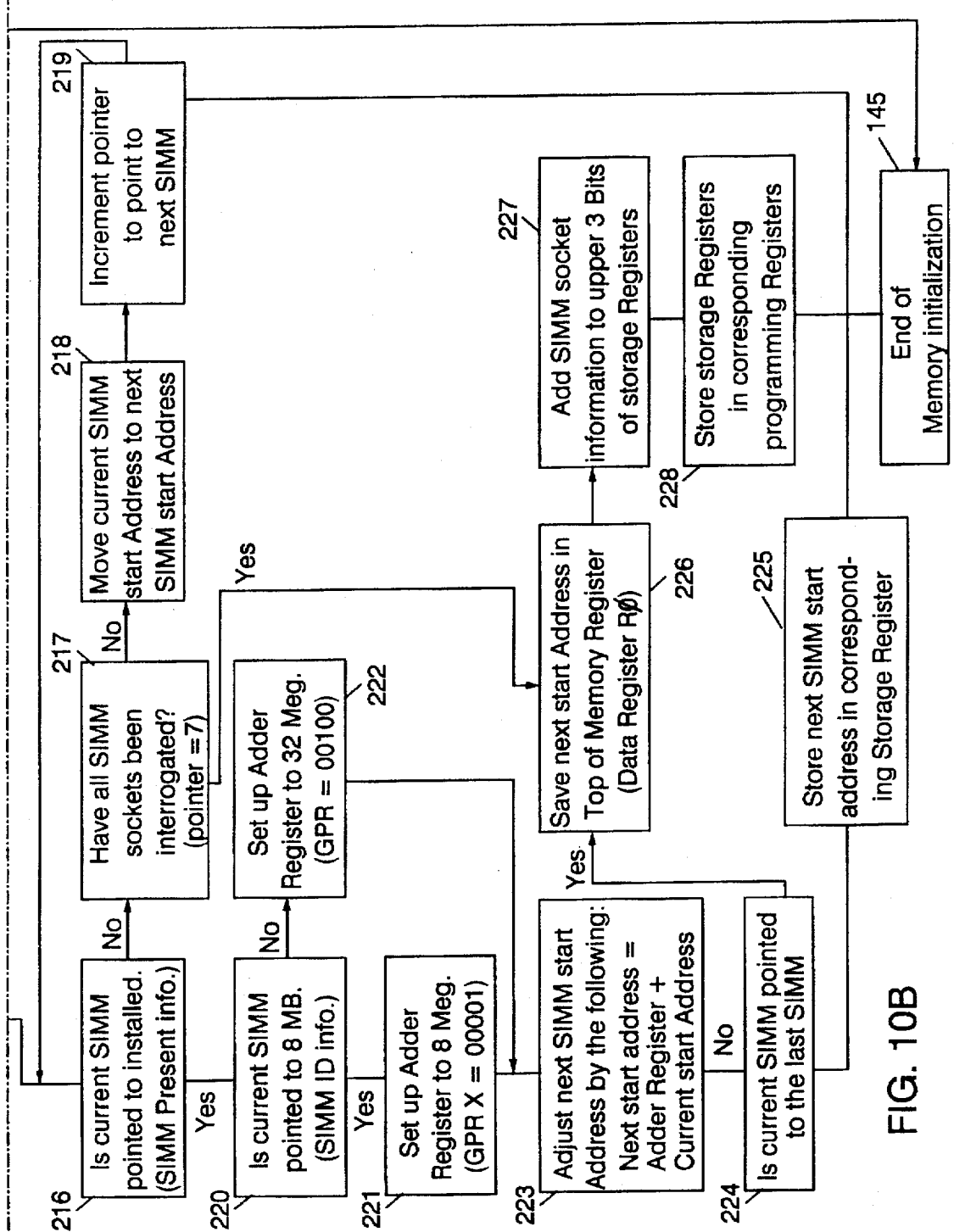

The flow chart of FIG. 10 illustrates the testing of memory 40 and, in the event of detecting a faulty installed SIMM, establishing a new memory configuration and reprogramming the memory controller 36 for the new configuration and reprogramming the memory controller 36 for the new configuration.

The testing of memory starts at step 140 in the flow chart of FIG. 10. In step 141, the SIMM presence register 70 is saved by storing its contents into the general purpose register R8 (FIG. 3). In step 142, the SIMM ID register 71 is saved by storing its contents into the general purpose register R9.

In step 143, the installed SIMMs of the memory 40 are tested. The testing is performed using any one of the standard address and data testing of memory as implemented in various personal computer systems available at this time.

As this testing is being performed, the firmware routine will preserve the SIMM presence and ID (type) information for each socket 61-0 to 61-7 stored in registers R8 and R9 during steps 141, 142.

During memory testing in step 143, each of the installed SIMMs is determined to be faulty or free of faults. If a SIMM is determined to be faulty, it is marked as such and logically removed from the installed (presence) SIMM information by causing the CPU 30 to change the corresponding data bit in general purpose register R8 from 1 (SIMM present) to 0 (no SIMM present in socket).

At the completion of memory testing, step 144 determines whether or not any installed SIMM was faulty. If none was found faulty, the program branches to step 145, the completion of memory initialization.

If one or more SIMMs are determined to be faulty in step 144, the new installed (presence) information in general purpose register R8 is read by the CPU 30 and written into the presence register 70 (FIG. 3) in step 146.

The memory 40 and the controller 36 are now conditioned to be reprogrammed essentially in the same manner as that described with respect to the flow chart of FIG. 9. Step 211 is the same as step 111 of FIG. 9 in which the CPU 30 clears general purpose storage registers R0–R7 for calculating and storing SIMM starting addresses.

Because the general purpose registers R8 and R9 already contain the present and ID information for installed SIMMs, there is no need for steps 112, 113, 114 of FIG. 9 in the routine illustrated by the flow chart of FIG. 10. The ID values for faulty SIMMs are of little consequence since they will not be used in start address calculation; however, they may be set to whatever value (0 or 1) which is selected for "empty" sockets.

Steps 216–228 of the flow chart of FIG. 10 inclusive are identical to steps 116–128 inclusive of the flow chart of FIG. 9 and their explanation will not be repeated. However, at the end of step 228, a branch is made to the completion of memory initialization step 145.

Thus, the routine of FIG. 10 tests memory 40, maintains the same configuration if no SIMM fault is found and reconfigures the memory if a SIMM fault is found.

The improved method and means of the present invention thus provides an effective memory initialization routine for page mode memories which utilize start address registers for each SIMM socket for effecting the selection of row address strobe signals applied to corresponding sockets with installed SIMMs during the addressing of memory by the system CPU.

One advantage of this improved method and means lies in the arrangement whereby the starting address information for each SIMM socket is obtained in a tight loop environment without the requirement that the CPU 30 access the actual memory and memory controller hardware each time a calculation or other action is taken to further the computation of starting addresses. The hardware is polled once for SIMM presence and ID information and the start address for each socket is written once. It has the advantage of reuse if, subsequently, memory testing determines a SIMM fault. The algorithm is repeated and new start addresses are recalculated with each faulty SIMM being logically removed by specifying in the presence register 70 that the SIMM is not installed.

The instant invention has been shown and described herein in what is considered to be the most practical and preferred embodiment. It is recognized, however, that departures may be made therefrom within the scope of the invention and that obvious modifications will occur to a person skilled in the art.

What is claimed is:

1. In a data processing system having a processor including general purpose registers, a memory system including a plurality of sockets and a plurality of memory modules installed in at least certain of the sockets in any order, each socket connected to a respective controller register, and a memory controller connecting the processor and the memory system for controlling the accessing of the memory system, using memory module start addresses, during the execution of program instructions by the processor, the memory modules being available in differing memory sizes, a method for initializing the memory system and the memory controller through a process of configuration, testing and reconfiguration, comprising the steps of:

(a) storing in a controller presence register as one of the respective controller registers connected to the sockets, a presence information corresponding to, alternatively, whether a memory module is installed in each respective socket, (b) storing in a controller ID register as one of the respective controller registers connected to the sockets, a size information corresponding to amount of memory in each installed memory module, (c) clearing a group of the general purpose registers in the processor, at least one for each memory module socket, (d) setting the presence information, into a first additional general purpose register in the processor, (e) setting the size information into a second additional general purpose register in the processor, (f) operating the processor to calculate a start address for each said installed memory module in an ascending address order using the presence information and the size information, (g) configuring by storing each said calculated start address in one of the general purpose registers in the processor corresponding to the socket in which the corresponding memory module is installed, (h) operating the processor to store in memory controller programming registers, one for each respective socket, the start addresses in the corresponding general purpose registers in the processor, (i) testing the installed memory modules for faults by testing each installed memory module for receiving and storing data corresponding to the presence of a memory module, (j) changing in the first additional general purpose register the presence register value associated with each faulty installed memory module to correspond to the absence of a memory module in the respective socket, and (k) repeating steps (c), (f), (g) and (h) for reconfiguring the memory system and the memory controller.

2. In a data processing system having a processor including general purpose registers, a memory system including a plurality of sockets and a plurality of memory modules installed in at least certain of the sockets in any order and a memory controller connecting the processor and the memory system for controlling the accessing of the memory system, using memory module start addresses, during execution of program instructions by the processor, the memory modules being available in differing memory sizes, apparatus for configuring, testing and reconfiguring as a function of testing, to initialize the memory system and the memory controller, comprising:

a controller presence register connected to the sockets for storing presence Information corresponding alternatively to the presence or absence of a said memory module in each of the sockets, a controller ID register connected to the sockets for storing size information corresponding to the amount of memory in each installed memory module, a group of general purpose registers within the general purpose registers in the processor, at least one general purpose register within the group of general purpose registers for each memory socket for storing starting addresses of each respective socket, program means controlled by the processor for setting the presence information and the size information, respectively, into first and second additional general purpose registers in the processor, program means for operating the processor to calculate a socket start address for each said installed memory module in an ascending address order using the information stored in the corresponding first and second additional general purpose registers, means for configuring by storing each said calculated socket start address in one of the general purpose registers in the processor corresponding to the socket in which the corresponding memory module is installed, program means for operating the processor to store in controller programming registers, one for each respective socket, the start socket addresses in corresponding general purpose registers in the processor, means for testing the installed memory modules for faults, means for changing in the first additional general purpose register in the processor the presence information associated with each faulty installed module to correspond to an absence of a said memory module in the respective socket, and means for recalculating the socket start addresses using the changed presence register values and for reconfiguring by storing the recalculated socket start addresses in the respective controller programming registers.

* * * * *